US006627478B2

(12) United States Patent
Smith et al.

(10) Patent No.: US 6,627,478 B2
(45) Date of Patent: Sep. 30, 2003

(54) METHOD OF MAKING A MICROELECTRONIC ASSEMBLY WITH MULTIPLE LEAD DEFORMATION USING DIFFERENTIAL THERMAL EXPANSION/CONTRACTION

(75) Inventors: John W. Smith, Horseshoe Bay, TX (US); Christopher M. Pickett, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/848,387

(22) Filed: May 3, 2001

(65) Prior Publication Data

US 2001/0055866 A1 Dec. 27, 2001

Related U.S. Application Data (63) Continuation-in-part of application No. 09/577,474, filed on May 24, 2000, now Pat. No. 6,333,207.
(60) Provisional application No. 60/135,634, filed on May 24, 1999.

(51) Int. Cl.[7] .......................... H01L 21/44; H01L 21/48; H01L 21/50
(52) U.S. Cl. .......................... 438/106; 438/50; 438/51; 438/54; 438/55; 438/457; 438/799
(58) Field of Search ................. 438/106, 118, 438/611, 617, 612, 107, 54, 55, 50, 51, 457, 799, 795; 228/180.5, 180.21

(56) References Cited

U.S. PATENT DOCUMENTS

| | | | | |
|---|---|---|---|---|
| 3,665,589 A | * | 5/1972 | Farrell | 228/199 |
| 3,825,353 A | * | 7/1974 | Loro | 257/735 |
| 4,989,069 A | * | 1/1991 | Hawkins | 257/693 |
| 5,518,964 A | * | 5/1996 | DiStefano et al. | 438/113 |
| 5,763,941 A | * | 6/1998 | Fjelstad | 257/669 |
| 6,046,910 A | * | 4/2000 | Ghaem et al. | 361/760 |
| 6,110,761 A | * | 8/2000 | Ahmad | 438/118 |
| 6,221,749 B1 | * | 4/2001 | Kirloskar et al. | 438/611 |
| 6,333,207 B1 | * | 12/2001 | Light et al. | 438/106 |

* cited by examiner

Primary Examiner—Stephen D. Meier
Assistant Examiner—Khanh Duong
(74) Attorney, Agent, or Firm—Lerner, David, Littenberg, Krumholz & Mentlik, LLP (57) ABSTRACT

A microelectronic assembly is made by bonding the tip ends of leads on a first element to bonding contacts on a second element. The tip ends of the leads are releasably connected to the first element, so that the leads are held in place during the bonding process. After bonding, the first and second elements are heated or cooled to cause differential thermal expansion, which breaks at least some of the releasable attachments of the tip ends, leaving the leads free to flex.

34 Claims, 5 Drawing Sheets

METHOD OF MAKING A MICROELECTRONIC ASSEMBLY WITH MULTIPLE LEAD DEFORMATION USING DIFFERENTIAL THERMAL EXPANSION/CONTRACTION

CROSS-REFERENCE TO RELATED APPLICATIONS

The present application is a continuation-in-part of U.S. patent application Ser. No. 09/577,474, filed May 24, 2000, now U.S. Pat. No. 6,333,207, the disclosure of which is hereby incorporated by reference herein. Said U.S. patent application Ser. No. 09/577,474 claims benefit of U.S. Provisional Patent Application No. 60/135,634 filed May 24, 1999, the disclosure of which is hereby incorporated by reference herein.

BACKGROUND OF THE INVENTION

As described in certain embodiments of U.S. Pat. No. 5,518,964, the disclosure of which is incorporated by reference herein, an element used in a microelectronic assembly may have elongated flexible leads extending along a surface of the element. Each lead has a first or terminal end permanently attached to the element and has a tip end offset from the terminal end. A second element having contacts thereon is engaged with the first element so that the tip ends of the leads are bonded to contacts on the second element. The first and second elements are then moved away from one another so as to deform the leads and provide vertically extensive leads extending between these elements. A compliant material may be introduced between the elements during or after such motion. The resulting structure allows relative movement of the elements without substantial stresses on the leads. This process can be used, for example, to make packaged semiconductor chips. One of the elements may be a connection component desirably having a flexible structure incorporating one or more dielectric layers, and the other one of the elements may be a chip, wafer or assemblage of chips. The leads may be provided either on the connection component or on the chips or wafer.

As described in U.S. Pat. No. 5,763,941, the disclosure of which is also incorporated by reference herein, a releasable lead structure may be made by providing a first region of a lead permanently connected to a component and a second region releasably connected to a surface of the component so that the second region can be peeled away from such surface. Desirably, the second region is attached to the underlying surface by a release interface having a peel strength of less than about $0.35 \times 10^6$ dynes/cm; i.e., a peel strength of less than about 2 pounds per linear inch. For example, certain low-energy vapor deposition processes such as electroless plating or chemical vapor deposition can deposit a thin layer of release metal forming a release interface with the underlying layer. The lead may incorporate a structural metal which may be the same as or different from the release metal. The release metal can be peeled away from the underlying layer. In other embodiments, the interface may include a layer of a first release metal securely bonded to the underlying layer and a second release metal on the lead, the first and second release metals being weakly bonded to one another so that the second region of the lead can be pulled away from the underlying layer, with the first release metal remaining on the underlying layer.

Despite all of these improvements, still further improvements and variations would be desirable.

SUMMARY OF THE INVENTION

One aspect of the invention provides methods of making microelectronic assemblies. The method according to this aspect of the invention desirably includes providing a first element having a first surface and a plurality of leads extending over said first surface, the leads having anchor ends attached to the first element and tip ends remote from said anchor ends releasably attached to the first element. The method desirably further includes connecting the tip ends of the leads to a second element. The releasable attachment of the tip ends maintains the tip ends in position relative to said first element at least until commencement of said connecting step. After the tip ends of the leads have been connected to the second element, differential expansion or contraction of said elements is induced, most preferably by heating or cooling one or both of the elements. This differential expansion or contraction moves tip ends of the leads relative to the first element and breaks at least some of the releasable attachments. Breakage of the releasable attachment allows the tip ends of the leads to move relative to the first element. This breaking action frees the tip ends of the leads, so that the leads are free to flex during service of the finished device.

The releasing action caused by differential expansion or contraction can be combined with vertical movement of the elements away from one another to bend the leads to a vertically-extensive disposition. The releasing action caused by differential expansion or contraction avoids or reduces the need to break the tip ends away from the first element during vertical movement, and thus facilitates the vertical movement of the elements away from one another. In certain embodiments, the differential expansion or contraction of the elements can actually cause the vertical movement. As further discussed below, the elements can be linked by relatively strong restraining straps oriented so that the ends of the restraining straps will move in horizontal directions towards one another during differential expansion or contraction of the elements. Buckling of the restraining straps causes one end of each restraining strap to move with a vertical component of motion, thereby moving the elements away from one another. In other embodiments, buckling of the leads induces vertical movement of the elements away from one another.

Where the first and second elements have different coefficients of thermal expansion, the step of inducing differential expansion or contraction may include altering the temperature of both of the elements. The connecting step can include bonding the tip ends of the leads to said second element while both of said elements are at an elevated temperature, and the step of altering the temperature of both of said elements may include cooling these elements.

In certain preferred embodiments, one of the elements includes one or more semiconductor chips and the other one of the elements includes a connection component having oppositely-directed inner and outer surfaces and terminals exposed to the outer surface. The connecting step is performed so that the inner surface of the connection component faces toward the one or more semiconductor chips, and the outer surface of the connection component faces away from said one or more semiconductor chips and so that at least some of said leads are electrically connected to at least some of said terminals. Thus, the chips are connected to the terminals. Preferably, a flowable material is injected between the one or more semiconductor chips and the connection component after the connecting step. The flowable material is cured to form a layer surrounding the leads. The resulting structure provides one or more packaged semiconductor chips having terminals connected to the contacts on the chip, the terminals being movable relative to the chips.

These and other objects, features and advantages of the present invention will be more readily apparent from the detailed description of the preferred embodiments, set forth below, taken in conjunction with the accompanying drawings.

DETAILED DESCRIPTION

Figure 1:
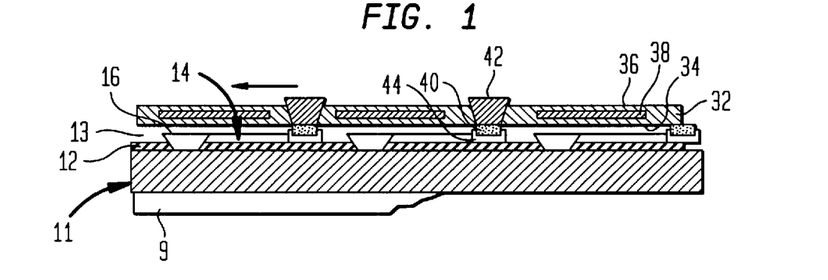
FIG. 1 is a fragmentary sectional view depicting elements during a manufacturing process in accordance with one embodiment of the present invention.

A process according to one embodiment of the invention utilizes a first element 10 which includes a plurality of semiconductor chips 11 mounted on a common base 9. Base 9 in this embodiment is formed from a material such as quartz or glass having a coefficient of thermal expansion ("CTE") similar to that of silicon. The chips are attached to the base by an adhesive which can be degraded by radiation in a degradation wavelength band such as ultraviolet light, and the base is transparent to such radiation. Other degradable adhesives, such as soluble adhesives, and other types of temporary attachments, such as mechanical clamping arrangements, can be used to secure the chips to the base. The use of degradable adhesives as a temporary attachment in certain microelectronic structures is further described in commonly assigned U.S. patent application Ser. No. 09/317,675, filed May 24, 1999, the disclosure of which is incorporated by reference herein. Each semiconductor chip includes a passivation layer 12, typically formed from an inorganic material such as an oxide or nitride, or an organic material such as polyimide or benzocyclobutene ("BCB"), defining a first surface 13 of the chip, and hence defining a portion of the first surface of element 10. A large number of leads 14 are provided on each chip. Each lead has an anchor end 16 connected to internal structures (not shown) within the chip 11 through an opening in passivation layer 12, such that the anchor ends of the leads are permanently attached to the chip and electrically connected to the internal elements of the chip. Each lead also includes a tip end 18 remote from the anchor end and an elongated portion 20 extending between the anchor end and the tip end over the first surface of the chip, i.e., over the exposed surface defined by the passivation layer 12. The tip end 18 and elongated region 20 of each lead are only weakly bonded to the surface of layer 12. The bond strength in this region of the lead should be low enough that the bond between the tip end and the elongated region can be broken during the process discussed below but should be sufficient to hold the elongated portion 20 and tip end 18 of each lead in place during handling up to the time this bond is deliberately broken. As further discussed below, the bond between the tip end of the lead and the first surface 13 of the chips will be broken by forces applied through bonds made to the tip ends for purposes of electrical interconnection. Thus, the maximum bond strength between the tip end of the lead and the first surface of the wafer will vary somewhat depending upon the bond strength achievable during the electrical interconnection process. However, for typical leads about 200–1,000 microns long, about 10 microns–20 microns thick and about 10 microns–50 microns wide, the bond between each lead and the underlying surface 13 may have a strength such that the bond can be broken by an upward force (directed away from the first surface 13) of a certain magnitude. The magnitude of the upward force required to break the bond between a lead and the first surface is referred to herein as the "upward pull bond strength." The upward pull bond strength desirably is at least 0.25 grams force per lead, more preferably at least 0.5 grams force per lead. Preferred ranges for the upward pull bond strength are, 0.25 grams force to 4 grams force ($0.25 \times 10^3$ to $4 \times 10^3$ dynes), and more preferably 0.5 to 2 grams force ($0.5 \times 10^3$ to $2 \times 10^3$ dynes). Leads 14 can be formed on surface 13 with a releasable bond of the type discussed above by any of numerous processes. For example, the leads may be formed by an additive plating process on the exposed surface 13 of the passivation layer. As the first step of such a process, a thin tie layer of a metal such as copper, nickel, monel or other electrically conductive metal is deposited over the passivation layer, and the metal constituting the leads is then deposited by electroplating on this thin layer, using a mask layer (not shown) having openings at areas where the leads are to be deposited. After removal of the mask layer, the thin tie coat layer is etched away, leaving the leads in place. The thin tie layer remains in place between the leads and the passivation layer 12. Provided that the metal of the leads adheres strongly to the metal of the tie layer, the strength of adhesion between the tip ends of the leads and the passivation layer is controlled by the strength of adhesion between the tie layer and the passivation layer. This, in turn, depends upon the conditions used to deposit the tie layer. For example, where the tie layer is deposited by sputtering, the strength of adhesion depends on the energy applied in the sputtering process, as well as the composition of the tie layer and passivation layer.

Figure 3:
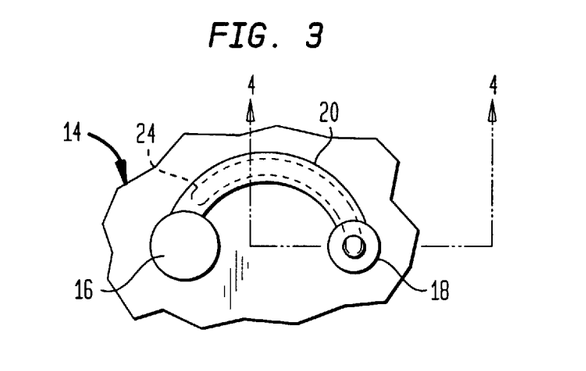
FIG. 3 is a fragmentary plan view on an enlarged scale of the element shown in FIG. 2.

Alternatively, the leads may be formed on the surface of the passivation layer under conditions which tend to promote a strong bond between the leads and the passivation layer as, for example, by using a tie layer deposited under conditions which promote adhesion between the tie coat and the passivation layer and between the tie coat and the metal of the leads. After deposition of the leads and removal of the tie layer (except at areas underlying the leads), the passivation layer is etched using an etchant which attacks the passivation layer but which does not substantially attack the metal constituting the leads. For example, as disclosed in cop ending, commonly assigned United States patent applications [158 and 188] the disclosures of which are hereby incorporated by reference herein, a polyimide layer may be etched by a plasma such as a plasma of a gas including oxygen or other oxidizing gases. The plasma attacks the surface of the passivation layer, so that the surface 13 recedes. However, in the regions covered by the tip ends 18 and elongated sections 20 of the leads, the surface is shielded by the lead itself. Under these conditions, the material of the passivation layer 12 is removed from beneath the leads beginning at the edges of the leads. The process is stopped before the material beneath the leads has been entirely etched away, so that a small, etched defined connection section 22 (FIGS. 3 and 4) remains beneath the tip end 18 of each lead. The connection section associated with each lead may also include an elongated strip like region 24 (FIG. 3) extending beneath the elongated region of each lead. Thus, the resulting connection sections 22 and 24 have horizontal dimensions (in directions parallel to the first surface 13 of the passivation layer) smaller than the corresponding dimensions of the lead itself. The elongated strip like region 24 is narrower than the elongated section of the lead. Thus, at the conclusion of the etching process, the tip end 18 and elongated section 20 of each lead are attached to the passivation layer 12 and hence to the first element 10 by means of the etched-defined connection section 22 and elongated region 24. Thus, the strength of the connections between the tip ends of the leads and the first element 10 depends on the dimensions of the connection sections. The connection sections 22 and 24 can be broken when the leads are displaced relative to the first element, but have sufficient strength to hold the leads in place prior to the assembly process discussed below.

In another variant, as disclosed in the aforementioned '964 patent, connection sections having dimensions smaller the corresponding dimensions of the leads can be formed from a metallic layer having composition different from that of the leads themselves. Thus, the layer of a first metal can be deposited on the first surface 13 of the first element and then leads formed from a second metal can be deposited onto this layer. Following deposition of the leads, the surface is exposed to an etchant which attacks the first metal but which does not substantially attack the second metal. For example, the first metal may be copper and the second metal may be gold; an $HCl/CuCl_2$ etchant will etch the copper without substantially etching the gold. Alternatively, the first metal may be aluminum and the second metal may be copper; an alkaline etchant will substantially etch the aluminum without etching the copper. In either case, a small, etch-defined connection element is left beneath the lead, so that the strength of the connection between the tip end of each lead and the first element is controlled substantially by the horizontal dimensions of the etch-defined connection element.

Figure 2:
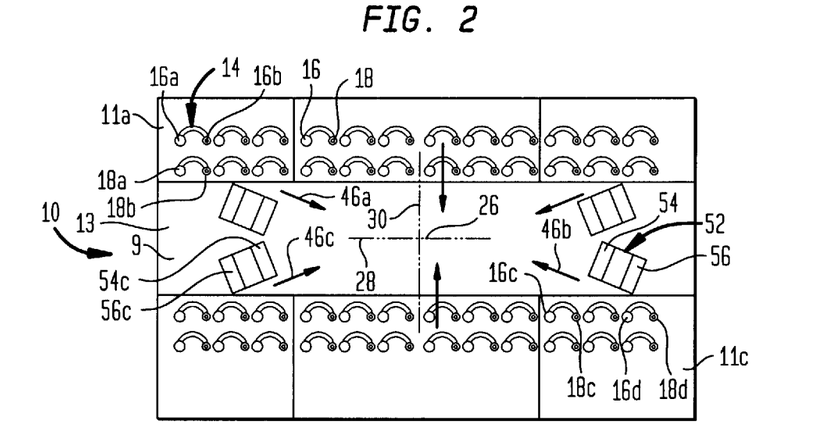
FIG. 2 is a top plan view of an element used in the process of FIG. 1.
Figure 4:
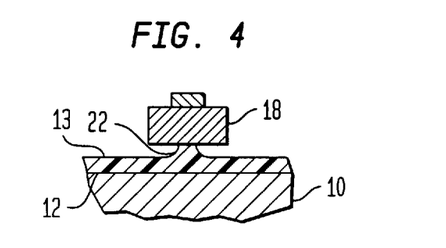
FIG. 4 is a fragmentary cross-sectional view taken along line 4—4 in FIG. 3.

Leads 14 are initially curved. That is, as seen in plan view looking in a vertical direction (as in FIGS. 2 and 3) the centerline of the elongated portion 20 of each lead does not extend along the shortest straight line between the anchor end 16 and the tip end 18 of the lead. The particular leads shown in FIGS. 2 and 4 are generally arcuate as seen in plan view. However, other lead shapes may be employed. For example, the leads as initially provided on the first surface 13 of element 10 may be generally S-shaped or V-shaped as seen in plan view. The configurations as disclosed in preferred embodiments of U.S. Pat. No. 5,859,472 ['098] the disclosure of which is hereby incorporated by reference herein may be employed. Leads as disclosed in cop ending, commonly assigned U.S. patent application Ser. No. 08/712,855, the disclosure of which is incorporated by reference herein, ['074; "Pair of Pants"] may also be employed.

The chips 11 are arranged on base 9 so that leads 14 define a pattern having a central point 26. As used in this disclosure, the central point is the point where the vector sum of the distance vectors from the central point to the tip ends of the various leads is zero. In the particular example depicted in FIG. 2, the lead pattern is symmetrical about two axes 28 and 30 passing through the central point 26, but this is not essential. Also, although the particular leads depicted are disposed in regular rows, other lead patterns may be employed. In the pattern depicted in FIG. 2, all of the tip ends 18 are remote from the central point 26.

A second element 32 includes a connection component having a dielectric body having an inner surface 34 and an oppositely directed outer surface 36. The particular connection component depicted in FIG. 1 is a relatively thick, rigid plate like structure incorporating dielectric layers defining the inner and outer surfaces 34 and 36 and one or more with a thick, metallic plate like elements 38 disposed between these surfaces. Bonding contacts 40 are exposed at the inner surface 34 of connection component 32, whereas terminals 42 are exposed at the outer surface 36. In the simplified embodiment showed in FIG. 1, the bonding contacts 40 and terminals 42 are provided as opposite ends of unitary via structures extending entirely through the connection component, so that each bonding contact 40 is connected to a terminal 42 directly overlying the bonding contact. In practice, more complex interconnection structures can be used. For example, connection component 32 may include one or more layers of traces extending in horizontal directions along one or both surfaces or the connection component or between layers of the connection component. Interconnections between bonding contacts 40 and terminals 42 may be made through these traces, so that some of the bonding contacts are connected to terminals 42 at horizontal locations different from the horizontal location of the particular bonding contacts. The bonding contacts 40 and terminals 42 are disposed in sets, so that the bonding contacts appropriate for connection to one chip 11 are arranged within one region of the connection component. Also, it is not essential that all of the bonding contacts 40 be connected to terminals 42, or vice-versa. Typically, most of the bonding contacts and terminals will be used to carry signals to or from the semiconductor chip in service. One or more of bonding contacts 40 and one or more terminals 42 of each set may be connected to internal metal plates 38. Typically, these connected features carry ground, a power supply voltage or other predetermined potential so that the plate or plates 38 within the connection component serve as potential reference planes for the assembly. The other bonding contacts 40 and terminals 42 are electrically isolated from plate 38.

The metal plate or plates 38 constitute a significant portion of the material within the connection component 32. Also, the elastic modulus of the plate or plates 38 is substantially higher than the elastic modulus of the dielectric material incorporated in connection component 32. Accordingly, the coefficient of thermal expansion ("CTE") of the connection component as a whole will be close to the coefficient of thermal expansion of plates 38. Where plates 38 are formed from copper, the CTE of connection component 32 will be close to that of copper, i.e., about $17 \times 10^{-6}$ per ° C. Accordingly, the CTE of connection component 32 (measured in an unconstrained condition in which the connection component is not restrained by any other element) is substantially higher that the coefficient of thermal expansion of base 9 and chips 11, and thus substantially higher than the CTE of the first element 10. For example, where chips 11 are conventional silicon-based semiconductor chips, and base 9 is formed from silicon or from a material CTE-matched to silicone, the CTE of first element 10 is about 1 to about $6 \times 10^{-6}/°$ C., and typically about $3 \times 10^{-6}/°$ C.

Bonding contacts 40 are provided in a pattern similar to the pattern of tip ends 18 on the chip of the first element 10. However, the spacings between bonding contacts 40 are selected so that the pattern of the bonding terminals 40 is the same size as the pattern of tip ends 18 at the elevated bonding temperature used in the bonding step as discussed below. Thus, with the connection component at room temperature or below, the spacings between bonding terminals 40 on the connection component are somewhat smaller than the spacings between the corresponding tip ends 18 of the leads on the first element or chip 10.

In the process according to one embodiment of the invention, the first element 10 and the second element 32 are brought an elevated temperature. At this elevated temperature, the spacings between bonding terminals 40 are substantially equal to the spacings between tip ends 18 over the leads. The connection component and chip are aligned with another so that each bonding terminal 40 overlies the tip end 18 of the corresponding lead 14. Alignment between the tip ends of the leads and the bonding contacts can be achieved using conventional machine-vision systems. Fiducial marks (not shown) may be provided on the components to aid in this process, and the machine-vision system may be arranged to detect these fiducial marks and bring them into predetermined relative positions in the horizontal direction. Because the tip ends of the leads are retained in position on the first element or chip at this stage of the process, all of the tip ends can be brought into registration with all of the bonding contacts.

The elements are moved toward one another so that the aligned lead tip ends and bonding contacts engage one another. The engaged tip ends and bonding contacts are bonded to one another by bonding material carried on the lead tip ends, on the bonding contacts or both. Essentially any type of bonding material which is capable of forming the desired bond at elevated temperature can be employed. For example, where the tip ends and the bonding contacts incorporate a layer of gold, a thin layer of tin 44 may be provided on the lead tip ends, on the bonding contacts, or both before these elements are united with one another. At an elevated temperature of about 232 degrees C or more, the tin will alloy with the gold within the adjacent elements and form a liquid phase extending between these elements. As the elements are held at elevated temperature, the gold dissolves in the liquid tin, so that the gold content of the liquid phase increases and its solidus temperature also increases until the solidus temperature equals the prevailing elevated temperature, whereupon the liquid phase freezes to form a solid bond. Normally, the gold-bearing elements incorporate only a thin layer of gold in contact with the bonding material, so as to limit the maximum gold content in the finished bond. To promote bonding at lower temperatures, the bonding material may be a low-melting tin alloy such as a tin-lead eutectic which will allow bonding at temperatures as low as 183° C.

After the tip ends 18 have been bonded to the first element, both elements are cooled. As the elements cool, they tend to contract by different amounts. Because the coefficient of thermal expansion of the connection component is greater than that of the first element 10, the connection component tends to contract more than the chip. As the tip end of each lead is fixed to the bonding contact 40 on the second element or connection component 32, the tip end of each lead will tend to move with the adjacent portion of the second element or connection component. This causes movement of the tip ends of the leads relative to the first element or chip. The tip end of each lead tends to move inwardly toward center point 26. Stated another way, the pattern of tip ends 18 tends to contract relative to the chip, so that the various tip ends tend to move inwardly towards center point 26. For example, tip ends 18 and 18b, associated with chip l1b at the upper left-hand portion of the pattern seen in FIG. 2 tend to move relative to the first element 10 in the direction indicated by movement vector 46a, i.e., downwardly and to the right as seen in FIG. 2, whereas tip ends 18c and 18d, associated with chip 11c at the lower right-hand portion of the pattern, tend to move in the opposite direction (upwardly and to the left) as indicated by movement vector 46b. This horizontal movement of the tip ends breaks the tip ends free from their attachments to the first element or chip. The horizontal movement of each lead at this stage is produced by forces transmitted through the bond formed between the tip end of the lead and the mating bonding contact 40 on the second element. Therefore, the bonds between the tip ends of the leads and the bonding contacts should be stronger than the bonds between the tip ends of the leads and the chip as mentioned above, the bonds between the tip ends and the leads and the chip are relatively weak.

The horizontal movement caused by differential thermal expansion may be relatively small. For example, where the first element 10 has a CTE corresponding to that of silicon and the second element has a CTE substantially equal to that of copper, the differential movement caused by thermal expansion for a lead disposed about 1 cm from center point 26 cooling from about 300° C. to about 0° C. will be about 42 microns. However, even this small amount of horizontal movement can break the attachment between the tip ends and the chip. The movement of tip ends 18 and 18b relative to the chip and relative to the corresponding anchor ends 16 and 16b will tend to straighten these leads slightly. However, the degree of movement is less than that required to fully straighten these leads. By contrast, the movement of tip ends 18c and 18d relative to the anchor ends 16c and 16d will tend to increase the curvature of these leads.

Once the leads have been broken away from the chip, the leads are quite flexible. Therefore, connection component or second element 32 can be moved relative to the chip of first element 10. At this stage, the chips 11 can be separated from base 9 and connection component 32 can be cut into individual pieces, each including the bonding terminals 40 and contacts 42 associated with one chip or a few chips, so as to form individual units. Each unit is a packaged chip or chip assembly including a single chip or a set of chips together with the associated portions of connection component 38 and the associated terminals 42. For example, each such unit may be a chip-size package, in which some or all of the terminals 42 are disposed in the region of the connection component 32 overlying the chip. The portion of the connection component 32 in such a package may be about the same area as the chip itself. Other configurations, in which the connection component is larger than the chip, also can be employed.

Each such unit or packaged chip can be united with a circuit board or with another substrate which desirably has a CTE close to that of the connection component. For example, terminals 42 can be solder-bonded to the contact pads on a substrate. As the assembly is heated and cooled during temperature cycling in service or in an assembly operations, the connection component will expand and contract relative to the chip. However, such differential thermal expansion will not impose substantial stresses on the leads because the leads remain free to flex. Also the soldered bonds between terminals 42 and the substrate will not be subject to substantial stresses because the CTE of the connection component is well-matched to that of the substrate. Differential expansion and contraction of the chip and substrate will not impose substantial loads on the solder bonds between the terminals 42 and the substrate.

In a variant of this process, the first element 10 and second element 32 are moved away from one another through a pre-selected displacement so as to deform the leads towards a vertically extensive disposition after the tip ends 18 of the leads have been bonded to the bonding contacts 40 on the second element. These steps can be conducted as described in preferred embodiments of U.S. Pat. No. 5,518,964. For example, the first element 10 and second element 32 may be connected to platens of a fixture (not shown) during bonding, and these platens may be moved forcibly away from one another by conventional actuators such as motor-driven mechanical linkages, screw mechanisms, pneumatic or hydraulic cylinders and the like. This forcible movement can help to break the tip ends 18 of the leads away from the first element. Thus, any tip ends which are not broken away from the first element by the horizontal movement due to thermal effects can be broken away by the forcible vertical movement.

Figure 5:
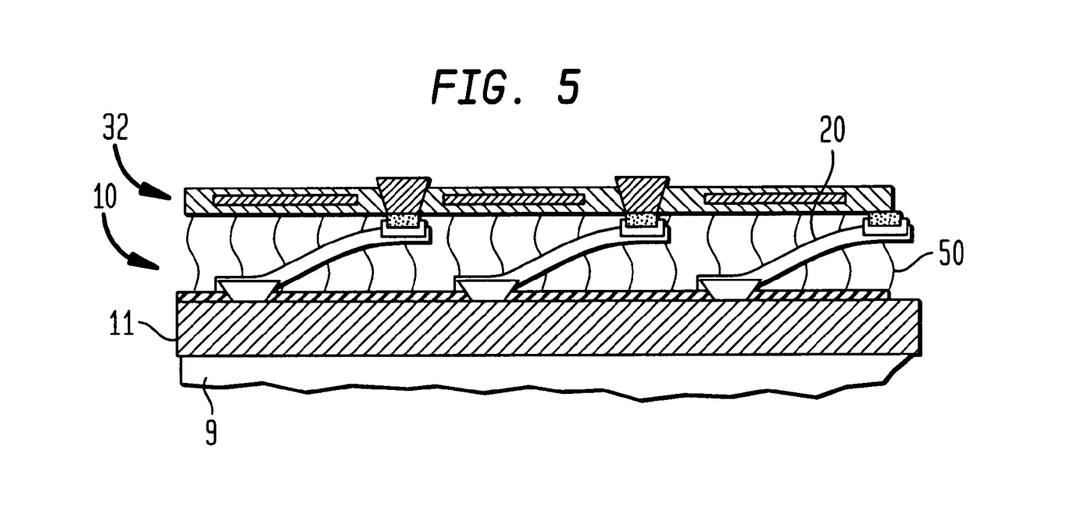
FIG. 5 is a view similar to FIG. 1, but depicting the elements at a later stage of the process.

During or after movement of the elements, a flowable composition is injected between the elements and around the leads so as to form a dielectric layer, desirably a compliant dielectric layer 50 (FIG. 5) such as a gel, elastomer or foam. As shown in FIG. 5, the resulting structure has vertically-extensive flexible leads 20' extending through the compliant dielectric layer 50 and connecting the bonding contacts 40 on second element 32 with the contacts 16 on the chip 11.

Figure 6:
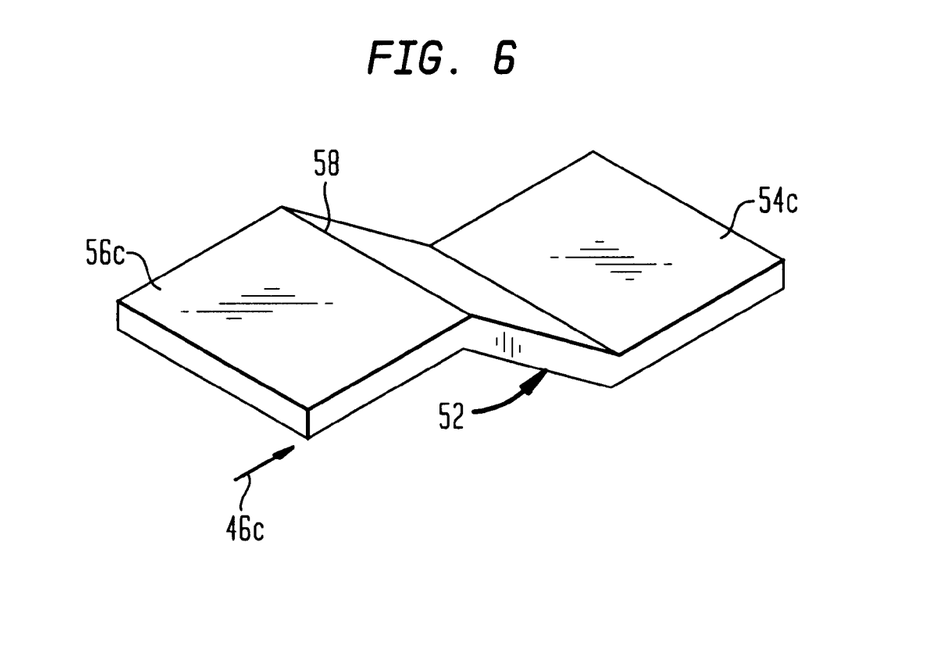
FIG. 6 is a diagrammatic perspective view of a part in the element of FIG. 2.

In a further variant, the vertical movement of the elements away from one another also can be impelled by differential thermal expansion or contraction. As seen in FIG. 2, restraining straps 52 may be provided. The restraining straps may be substantially larger and stronger than the leads 14. Each restraining strap has a first end 54 which is connected to the first element 10 and a second end 56 which is connected to the second element 32. For example, the restraining straps may be provided on the first element, with the first end of each restraining strap 54 bonded to the first element and the remainder of each restraining strap unbonded to the first element. The second end 56 of each restraining strap may carry bonding material which bonds to a pad (not shown) on the second element during the same bonding operation used to connect the lead tip ends to the contact pads. As initially provided on the first element, the restraining straps may be flat. The restraining straps are disposed on the first element with their second ends 56 further from center point 26 than their first ends. Stated another way, each restraining strap has a direction vector 57 from its first end 54 to its second end 56. The direction vectors of different restraining straps point in different directions. These direction vectors point outwardly, away from the center point 26 of the array. When the elements are cooled after bonding, the second end 56 of each restraining strap will move in a horizontal direction relative to the first end 54 of the same strap. This direction of motion is inward, toward center point 26, and opposite to the direction vector of the restraining strap. Thus, the second end of each restraining strap will move toward the first end of the same strap. For example, second end 56*c* moves toward first end 52*c*, in direction 46*c*. As best seen in FIG. 6, this horizontal motion causes the restraining strap to bend or buckle, forcing the second end 56 upwardly relative to the first end.

Thus, the restraining straps lift the second element 32 vertically away from the first element. The amount of vertical displacement will depend on the dimensions of the restraining straps and the amount of horizontal movement provided by differential thermal effects. Each restraining strap may have thin sections 58 at the junctions between the ends of the strap and the central portion of the strap. These thin sections act as hinges, and help to assure than the restraining straps bend at the thin sections to provide the desired lifting action. Each restraining strap may also be pre-bent, in a slightly S-shaped configuration similar to that shown in FIG. 6., prior to the bonding process. This further facilitates the lifting action.

In the particular embodiment illustrated in FIG. 2, the restraining straps are connected to the base 9 rather than to the chips 11. The restraining straps can be fabricated on the base by processes similar to those used to form the leads. In other embodiments, however, the restraining straps may be provided on the chips, and may be fabricated along with the leads. In this arrangement, the individual units formed at the conclusion of the process will include restraining straps extending between the chips and connection component. As disclosed in U.S. Pat. No. 5,976,913, the disclosure of which is incorporated by reference herein, restraining straps which are used to control displacement of the elements may also serve as leads as, for example, as ground or power leads. Where the restraining straps are to serve as leads, they are connected to appropriate contacts on the chip and to bonding pads on the connection component. As disclosed in greater detail in the '913 patent, the restraining straps constrain motion of the elements relative to one another. However, in this embodiment of the present invention, the restraining straps actually cause relative vertical motion of the elements, in addition to constraining such motion.

In a variant of the processes discussed above, the individual chips 11 may be individually aligned with the connection component or second element 32, and the tip ends of each lead may be bonded to the bonding contacts 40, before bonding the chips to base 9. For example, each chip may be held in a hot chuck and advanced into engagement with the connection component. The chips are then bonded to the base while the chips and base are at an elevated temperature, and then the elements are cooled as described above. In this embodiment, the first element 10 is formed in place, on the second element 32, but the remainder of the process operates as described above.

In still other variants, the individual elements are heated or cooled to induce differential movement. For example, after bonding individual chips to the connection component, the chips and connection component may be cooled to room temperature and then bonded to the base. After bonding the chips to the base, the one element (the base or the connection component) may be heated while maintaining the other element at or near room temperature so as to move the chips relative to the connection component. Alternatively, one element may be cooled while maintaining the other element at an elevated temperature. Depending upon which element is heated or cooled, the directions of relative movement caused by thermal effects are reversed. If restraining straps are employed to provide lift, the direction of the restraining straps is reversed as well.

Figure 7:
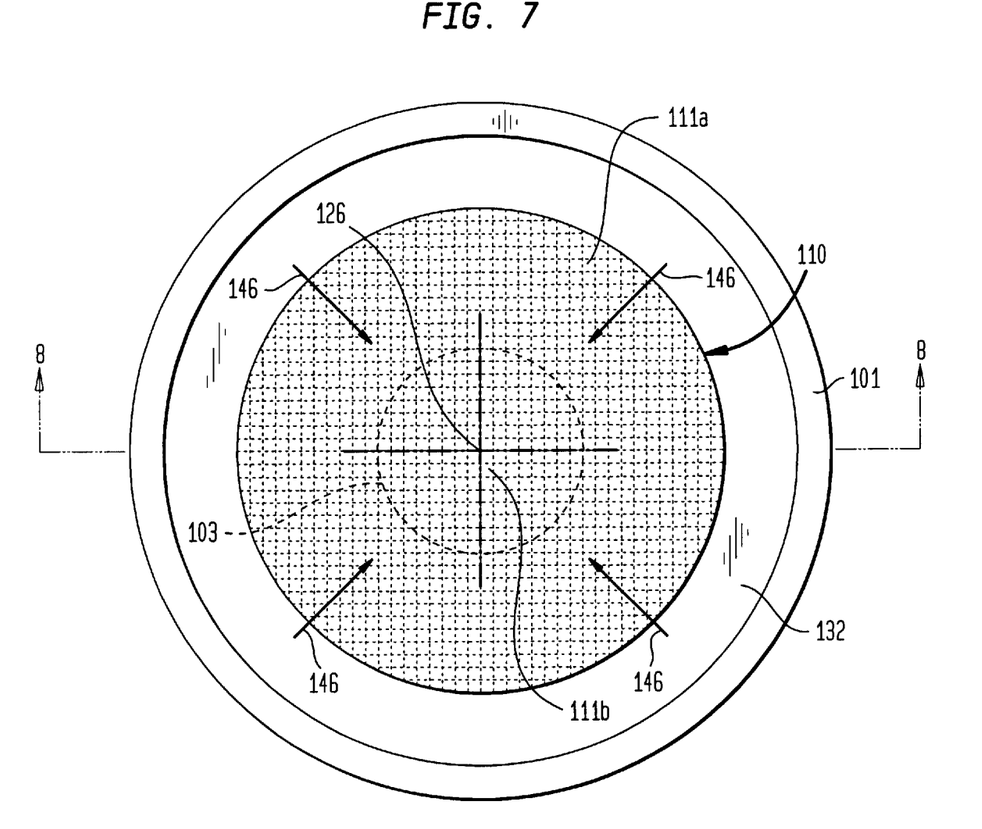
FIG. 7 is a diagrammatic top plan view of elements used in a process according to a further embodiment of the invention.
Figure 8:
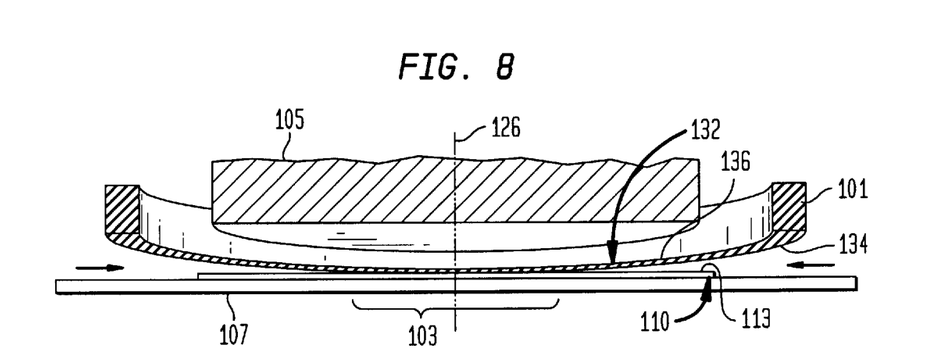
FIG. 8 is a diagrammatic sectional view along line 8—8 in FIG. 7.

As shown in FIGS. 7 and 8, the first element 110 may be a wafer incorporating a large number of semiconductor chips 111 disposed side-by-side, whereas the second element may be a connection component incorporating a flexible dielectric sheet. The connection component is held taut by a rigid frame 101 which may be in the form of a circular ring having a CTE larger than that of the wafer. Thermal expansion and contraction of the sheet is substantially controlled by the frame or ring 101. The connection component has bonding contacts (not shown) on an interior surface 134 facing toward the wafer, and also has terminals (not shown) on an exterior surface 136, facing away from the wafer. The wafer 110 has individual leads (not shown) on its first surface 113 facing toward the connection component. The leads, terminals and bonding contacts may be similar to those discussed above with reference to FIGS. 1–5. The pattern of bonding contacts on the connection component is selected to match the pattern of lead tip ends on the wafer when the connection component 132 and frame 101 and wafer 110 are at an elevated bonding temperature. The connection component can be fabricated by processes such as additive plating and subtractive etching while the dielectric sheet is held taut on the frame. Processes for handling and forming sheets on frames are taught in preferred embodiments of U.S. patent application Ser. Nos. 09/173, 797 and 09/174,074 the disclosures of which are incorporated by reference herein.

While both components are at the bonding temperature, the connection component and wafer are engaged with one another and the lead tip ends are bonded to the bonding contacts on the connection component. After bonding, the components are cooled, preferably to about room temperature. Frame 101 and sheetlike connection component 132 contract more than wafer 110 during cooling. Thus, in this embodiment as well, at least those regions of the connection component remote from center point 126 move relative to the wafer with a horizontal component of motion directed inwardly, toward center point 126, thereby breaking the tip ends of the leads away from the surface of the wafer or first element 110. Thus, the tip ends of those leads associated with chips near the periphery of the wafer, remote from center point 126, such as the leads associated with chip 111*a* (FIG. 7) are broken away from the wafer surface and are free to flex. However, in a central zone 103 of the component and wafer, the tip ends of the leads may remain attached to the wafer. During or after this process, the frame 101 is moved upwardly away from the wafer. In the beginning of this lifting process, the periphery of the sheetlike component 132 will move upwardly with the frame. In this condition, the sheetlike component will tend to bow downwardly near center point 126. The degree of bowing in the sheet is greatly exaggerated for clarity of illustration in FIG. 8. As the lifting process continues, the tip ends at the outer edge of central zone 103 are broken away from the wafer, so that the central zone becomes progressively smaller. The process continues until the tip ends of all of the leads in the central zone are broken away from the wafer.

In this embodiment, less than all of the lead tip ends are broken away be the horizontal movement due to thermal effects. However, the detachment caused by thermal effects facilitates the lifting process; it is not necessary to apply sufficient force to break the tip ends of many leads away from the wafer simultaneously. The sheet can be lifted away from the wafer by lifting the ring using mechanical means such as a fixture.

A fluid such as a gas or a liquid as, for example, a curable encapsulant, can be introduced under pressure between the wafer and the connection component to lift the sheet away from the wafer. The fluid pushes upwardly on the entire sheet, causing the tip ends of the leads in central region 103 to break away from the wafer. A platen or other fixture 105 may be placed above the connection component or sheet 132 to limit its upward motion, whereas wafer 110 may be supported on a further platen 107. Here again, release of the tip ends in the peripheral portion of the sheet facilitates introduction of the fluid between the sheet and wafer, and facilitates peeling of the central zone away from the wafer.

Figure 9:
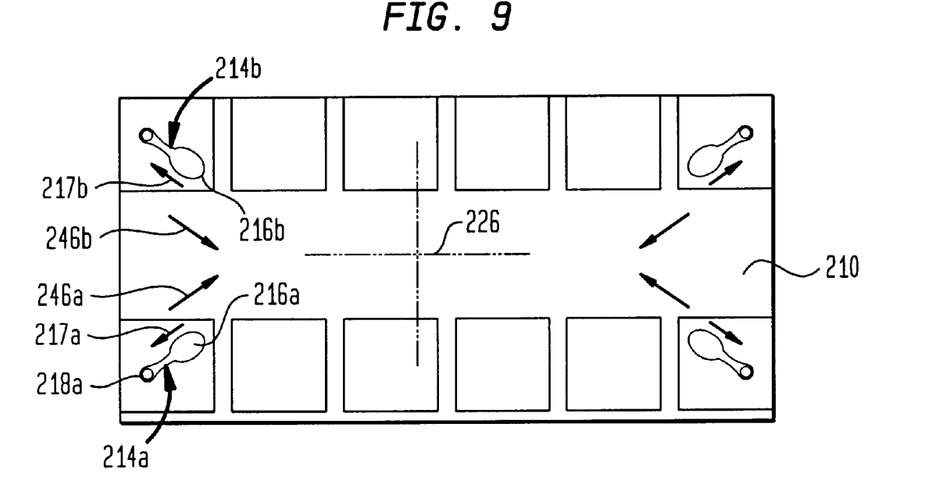
FIG. 9 is a top plan view of an element used in a process according to a further embodiment of the invention.

Alternatively or additionally, the peripheral regions of the sheet and the ring can be lifted by restraining straps connected between peripheral portions of the wafer and the overlying portions of the sheet. In certain cases, the resilience of the sheet itself will be sufficient to lift the central region once the peripheral region of the sheet has been lifted by the restraining straps. Thus, the initial motion caused by differential contraction lifts the peripheral portion of the sheet, and the tension in the sheet is sufficient to break the tip ends in the central region away from the wafer. Also, where the first element second element is substantially rigid, the central region will be lifted along with the peripheral region by the action of the restraining straps in the peripheral region. As discussed below in connection with FIG. 9, buckling or other deformation of the leads in the peripheral region can cause lifting in substantially the same way as buckling of the restraining straps. In a further variant, the leads in the peripheral region may have a different initial configuration than the leads in the central region. For example, the leads in the peripheral region may be substantially straight, whereas the leads in the peripheral region may be curved prior to movement of the elements. The lifting action of the leads in the peripheral region will promote or cause lifting of the central region.

In a further variant, the leads may be provided on a surface of a connection component such as a flexible or rigid dielectric substrate and may be bonded to the contacts on a chip or wafer. In yet another variant, the heating process may include application of energy through one or more of the components. For example, infrared energy may be applied through the thickness of the chip or wafer, as by applying infrared energy at a wavelength readily transmitted through silicon to the rear surface of the chip or wafer so that the infrared radiation passes through the chip or wafer to the leads and the components surrounding the leads. By applying only a brief, momentary burst of energy, the tip ends of the leads and the bonding contacts can be heated to effect bonding, while the mean temperatures of the connection component and wafer remain at or near their original temperatures. After forming the bonds, the connection component, the wafer, or both can be heated to cause differential thermal expansion. Differential thermal expansion of these components causes movement of the lead tip ends as discussed above, so that the releasable attachments of the lead tip ends are broken as in the embodiments discussed above. Processes for bonding lead tip ends using radiant heating are set forth in certain preferred embodiments of co-pending, commonly assigned U.S. patent application Ser. Nos. 09/523,512; 09/523,513 and 09/523,514, the disclosures of which are hereby incorporated by reference herein. As more fully described in certain preferred embodiments of those applications, bonding may be performed within a working space at least partially bounded by a flexible barrier. For example, the working space may be defined at least in part by one or both of the elements to be connected, and the flexible barrier may be a polymeric or other film extending between these elements. The working space may be brought to a low partial pressure of oxygen to limit the effect of oxides on the bonding process. The elements may be biased against one another by a fluid pressure outside of the working space exceeding the total absolute pressure within the working space. For example, where the total absolute pressure within the working space is below atmospheric pressure, atmospheric pressure will bias the elements toward one another. As taught in certain embodiments of the same applications, bonding materials can be activated by radiant energy directed through one or both of the elements to be connected, and the heating process may be a momentary heating process, such as by brief application of such radiant energy. As further disclosed in certain embodiments of these applications, elements to be connected to one another can be positioned and temporarily held in position relative to one another by a temporary bonding material, such as an adhesive which can be degraded by the bonding process itself.

In still other processes, a bonding process which uses heating in followed by a further heating step, to a temperature above the bonding temperature, to induce differential thermal expansion of the elements.

In the embodiments discussed above, the leads are initially curved when seen in plan view. However, any other lead shape, may be used. For example, in the embodiment of FIG. 9, leads 216 on first element 210 are substantially straight. However, the leads on different portions of the structure have different orientations. Lead 214a has a lead direction vector 217a, from its anchor end 216a to its tip end 218a During the heating or cooling process, the portion of the second element overlying lead 216a will move relative to the first element in the direction indicated by vector 246a, substantially opposite to the direction vector 217a of lead 216a. This will move tip end 218a toward anchor end 216a, and thus provide some slack in lead 214a. Lead 214b, in a different part of first element 210, has its direction vector 217b pointing in a different direction, opposite to the motion vector 246b of that part of the second element overlying lead 214b. The direction vectors of the leads all point outwardly, away from center point 226, so that the second ends 218 of the various leads will be moved inwardly by the thermally-induced motion of the second element. In this embodiment, the motion of the second ends of the leads toward the first ends tends to buckle the leads. Such buckling can cause vertical movement of the elements away from one another, in the same manner as buckling of the restraining straps 52 (FIG. 6). If the second element grows relative to the first element during the heating or cooling process, the direction vectors of the straight leads would be reversed, so that they would point inwardly, toward the center point. In both cases, however, the direction vectors of the leads are opposite to the local vector of motion of the second element relative to the first element.

In further variants, the movement of the elements relative to one another caused by heating or cooling includes vertical components of motion, as, for example, where one or both of the elements warps out of plane during heating or cooling. Such vertical motion can also release the tip ends of the leads from their attachment to the first element.

Figure 10:
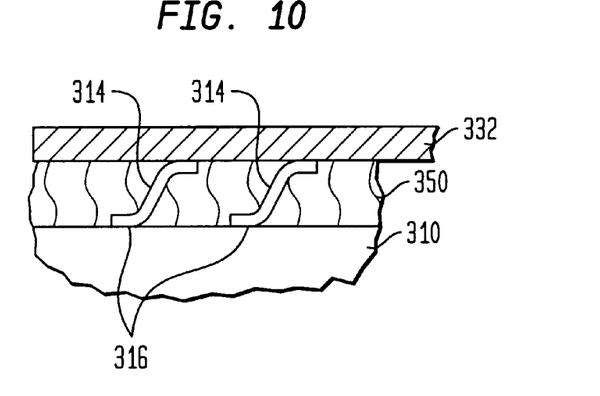
FIGS. 10 and 11 are diagrammatic sectional view of elements during a process according to yet another embodiment of the invention.
Figure 11:
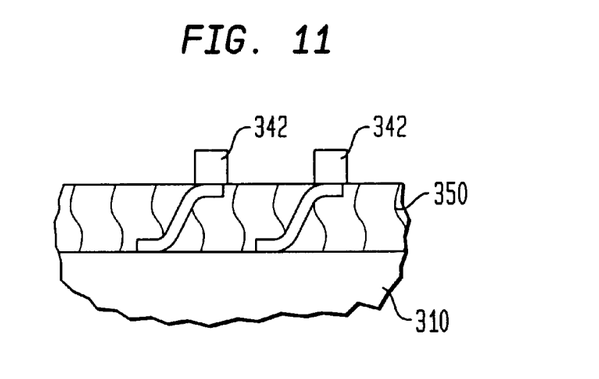

In the embodiments discussed above, the first element which bears the leads at the beginning of the process is a semiconductor element such as a set of chips or a wafer. However, the first element which bears the leads may be a connection component or circuit panel, and the second element may be a chip, wafer or other semiconductor structure. In further variants, neither element is a semiconductor structure. For example, both elements may be circuit panels or connection components. In yet another variant, one or both of the elements may be a metallic or other conductive sheet, such as sheet 332 (FIG. 10). After movement of the tip ends 316 of the leads away from the opposing element 310 and introduction of an encapsulant between the elements to form a layer 350 surrounding leads 314, the conductive sheet is etched so as to form terminals 342 connected to the leads (FIG. 11). Etching of the sheet to form the terminals can be performed as described in certain preferred embodiments of U.S. Pat. No. 5,989,936, the disclosure of which is incorporated by reference herein.

Figure 12:
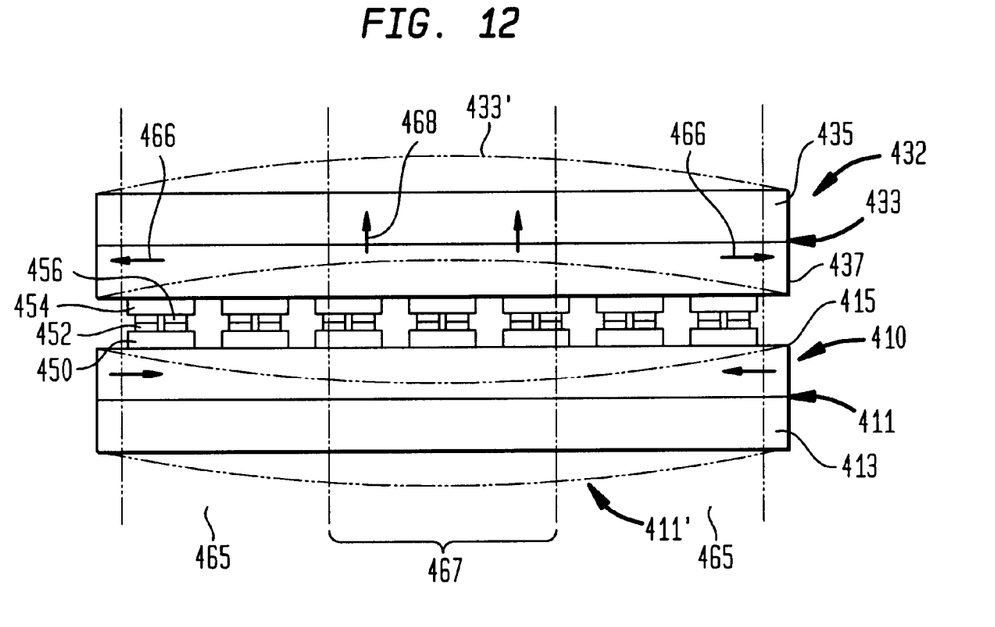
FIG. 12 is a diagrammatic elevational view of elements in a process according to another embodiment of the invention.

As shown in FIG. 12, the first element 410 includes a temporary carrier 411 formed from two layers 413 and 415 bonded to one another, the two layers having different coefficients of thermal expansion. The expansion properties of layers 413 and 415 are selected so that at the elevated temperature used for bonding, carrier 411 is flat, but at lower temperatures the carrier bows to a dished shape as shown in broken lines at 411'. The second element 432 also includes a temporary carrier 433 formed from two layers 435 and 437 bonded to one another. The coefficients of thermal expansion of the layers 435 and 437 are different from one another, and different from the coefficients of thermal expansion of layers 413 and 415. Merely by way of example, the layers constituting carrier 411 may be metallic layers whereas the layers constituting carrier 433 may be nonmetallic materials.

First element 410 includes a set of connection components 450, each incorporating a dielectric element having leads 452 on the sides of the connection components facing away from carrier 411. Each lead 452 has an anchor end permanently attached to the dielectric element which carries the lead and a tip or free end which is movable relative to the connection component and hence movable relative to the rest of the first element. As in the embodiments discussed above, the tip ends of the leads desirably are releasably connected to the connection component so that the tip ends will remain in place during manufacturing operations prior to bonding. The connection components 452 also have terminals (not shown) on the sides of the connection component facing toward carrier 411.

The second element includes further connection components 454 each including a dielectric element having bonding terminals 456 on the side facing away from carrier 433 and having terminals (not shown) on the side facing toward the carrier. The connection components 452 of the first element 410 are held on carrier 411 by a temporary adhesive or other temporary attachment, and the connection components 454 of the second element are temporarily attached to carrier 433. To simplify the placement of the connection components on the carriers, the connection components may be attached to the carriers while the carriers are at elevated temperature and hence flat.

With the carriers at elevated temperature, the carriers are united with one another in the condition depicted in solid lines in FIG. 12, and the tip ends of leads 454 on the first element are bonded to the bonding terminals 456 on the second elements. After bonding, the elements are allowed to cool. Upon cooling, the carriers contract by different amounts. Accordingly, in the peripheral zone 465 remote from the center of the lead pattern, the tip ends of the leads, which are now bonded to the second element, tend to move in a horizontal direction relative to the anchor ends of the leads, as indicated by vectors 466, which tends to detach the tip ends from the connection components and from the remainder of the first element 410 in the manner discussed above. Additionally, the carriers 411 and 432 tend to bow as indicated in broken lines at 411' and 433'. This bowing action tends to pull the tip ends of the leads away from the connection components 452 of the first element and from the remainder of the first element, as indicated by vectors 468. Thus, in this embodiment, some of the tip ends of the leads are detached by vertical movement of parts of the elements caused by warpage resulting from thermal effects. The remainder of the process operates in substantially the same way as discussed above. Thus, the elements may be moved away from one another through an additional, controlled displacement so as to bend the leads further towards a vertically extensive disposition. Preferably, a flowable material is injected between the connection components to form a further dielectric layer surrounding the leads. The resulting devices form connectors having terminals on opposite sides. The individual connectors are detached from the carriers, and can be placed between microelectronic devices.

The warpage effect can be employed in the other embodiments discussed above. In a variant of this approach, only one of the elements includes a carrier or other part arranged to warp. For example, a warping carrier can be used in conjunction with a non-warping carrier or with a solid, unitary wafer as the opposing element. Also, the warping effect can be employed even where both elements have the same overall coefficient of thermal expansion. In this case, there may be no horizontal movement (in the direction parallel to the carrier surface), so that detachment of the lead ends is caused entirely by the vertical displacement caused by warping. In a further variant, the warpage effect may be sufficient to produce all of the vertical displacement desired for bending the leads. The warpage effect can be controlled to provide the desired vertical displacement by preselecting the properties of the carriers or other structural components of the elements and the temperature differentials employed, or by use of physical constraining devices such as a pair of opposed platens r restraining straps. In yet another variant, the warpage effect discussed above, and lifting or vertical bending of leads produced by expansion or contraction of the elements as discussed above can be used with leads which initially do not have tip ends attached to the remainder of the element.

In the embodiments described above, the differential expansion or contraction of the elements is caused by heating or cooling them. Differential expansion or contraction can be caused by differential heating or cooling, i.e., by causing the temperature of one element to change by a different amount, or in the opposite sense, to the temperature of the other element. For example, even if the elements have the same CTE, differential expansion or contraction can be caused by heating one element while maintaining the other element at the same temperature or cooling the other element. Moreover, differential expansion or contraction of the elements may be caused in other ways which do not rely on thermal effects. For example, in an embodiment where one element includes a sheet held taut on a frame, as discussed above with reference to FIGS. 7 and 8, the sheet may be released from the frame, thereby releasing the tension in the sheet. This causes the sheet to contract.

As these and other variations and combinations of the features described above can be used without departing from the present invention, the foregoing description of the preferred embodiments should be taken by way of illustration rather than by way of limitation of the invention as claimed.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of making a microelectronic assembly comprising:

(a) providing a first element having a first surface and a plurality of leads extending over said first surface, said leads having anchor ends attached to said first element and tip ends remote from said anchor ends, the tip ends being releasably attached to said first element;
   (b) connecting said tip ends of said leads to a second element, said releasable attachment maintaining said tip ends in position relative to said first element at least until commencement of said connecting step;
   (c) causing differential expansion or contraction of said elements so as to move said tip ends relative to said first element and break at least some of said releasable attachments, and then
   wherein said step of causing differential expansion or contraction includes altering the temperature of at least one of said elements by a different amount than the other one of said elements.

2. A method of making a microelectronic assembly
   (a) providing a first element having a first surface and a plurality of leads extending over said first surface, said leads having anchor ends attached to said first element and tip ends remote from said anchor ends, the tip ends being releasably attached to said first element;
   (b) connecting said tip ends of said leads to a second element, said releasable attachment maintaining said tip ends in position relative to said first element at least until commencement of said connecting step;
   (c) causing differential expansion or contraction of said elements so as to move said tip ends relative to said first element and break at least some of said releasable attachments; and then
   (d) moving said elements away from one another through a predetermined displacement so as to bend the tip ends of the leads toward a vertically-extensive disposition.

3. A method as claimed in claim 2 wherein, prior to said step of causing differential expansion or contraction of said elements, said leads have an upward pull bond strength of at least 0.25 grams force.

4. A method as claimed in claim 2 wherein both of said elements are rigid.

5. A method of making a microelectronic assembly as claimed in claim 1
   wherein, prior to said step of causing differential expansion or contraction of said elements, said portions of said leads adjacent the tip ends of said leads are attached to frangible elements so that said portions of said leads adjacent said tip ends are releasably attached to said first surface by said frangible elements and wherein at least some of said frangible elements are broken by said differential expansion or contraction.

6. A method as claimed in claim 5 wherein said frangible elements are disposed between said portions of said leads adjacent said tip ends of said leads and said first surface.

7. A method of making a microelectronic assembly as claimed in claim 1
   wherein one of said elements is rigid and the other one of said elements includes a flexible sheet and a frame holding said flexible sheet in tension at least until commencement of said step of causing differential expansion or contraction.

8. A method as claimed in claim 7 wherein said step of causing differential expansion or contraction includes releasing said sheet from said frame.

9. A method of making a microelectronic assembly as claimed in claim 1 wherein
   (a) providing first and second elements having opposing surfaces extending in horizontal directions and leads connected between said opposing surfaces, and leads extending between said opposing surfaces;

(b) causing at least one of said elements to warp so as to deform at least a part of at least one of said opposing surfaces in a vertical direction away from the other one of said opposing surfaces and thereby deform at least some of said leads towards a vertically-extensive disposition.

10. A method as claimed in claim 9 wherein at least one of said elements includes a structural element having a plurality of dissimilar layers, said layers in said structural element having different coefficients of thermal expansion from one another, said step of causing differential expansion or contraction including changing the temperature of said structural element.

11. A method as claimed in claim 2 wherein said step of causing differential expansion or contraction of said elements includes altering the temperature of at least one of said elements.

12. A method as claimed in claim 11 wherein said first and second elements have different coefficients of thermal expansion.

13. A method as claimed in claim 12 wherein said step of causing differential expansion or contraction includes altering the temperature of both of said elements.

14. A method as claimed in claim 12 wherein said connecting step includes bonding said tip ends of said leads to said second element while both of said elements are at an elevated temperature and said step of altering the temperature of both of said elements includes cooling said elements.

15. A method of making a microelectronic assembly as claimed in claim 1
wherein one of said elements includes one or more semiconductor chips and the other one of said elements includes a connection component having oppositely-directed inner and outer surfaces and terminals exposed to said outer surface, said connecting step being performed so that the inner surface of the connection component faces toward said one or more semiconductor chips, the outer surface of said connection component faces away from said one or more semiconductor chips and so that at least some of said leads are electrically connected to at least some of said terminals, whereby said chips are connected to said terminals.

16. A method as claimed in claim 15 wherein said one of said elements includes a plurality of semiconductor chips and said other one of said elements includes a plurality of sets of said terminals, the method further comprising subdividing said elements after connecting said tip ends of said leads to said second element to thereby provide a plurality of units, each said unit including one or more of said semiconductor chips and a set of terminals connected to the one or more chips included in such unit.

17. A method as claimed in claim 16 wherein said one of said elements is a unitary wafer including said plurality of chips, said subdividing step including severing said wafer.

18. A method as claimed in claim 16 wherein said one of said elements includes a plurality of separate chips, said connecting step being performed so as to connect leads between said separate chips and said other one of said element seriatim.

19. A method as claimed in claim 16 wherein said other one of said elements includes a unitary structure including a plurality of regions, each said region bearing one said set of terminals, said subdividing step including severing said unitary structure so as to separate said regions from one another.

20. A method of making a microelectronic assembly as claimed in claim 1
wherein said step of causing differential thermal expansion or contraction includes causing at least one of said elements to warp so as to deform in a vertical direction transverse to said surface after said bonding step.

21. A method as claimed in claim 20 wherein said at least one of said elements includes a structural element having a plurality of dissimilar layers, said layers in said structural element having different coefficients of thermal expansion from one another, said step of causing differential expansion or contraction including changing the temperature of said structural element.

22. A method as claimed in claim 21 wherein said structural element is a temporary carrier, said at least one of said elements including one or more microelectronic elements releasably bonded to said carrier, the method further including removing said microelectronic elements from said carrier after the step of causing differential expansion or contraction.

23. A method as claimed in claim 21 wherein said structural element defines a substantially flat surface when said structural element is at an elevated temperature, said bonding step being performed while said structural element is at a said elevated temperature.

24. A method as claimed in claim 23 wherein said step of causing at least one of said elements to warp includes cooling said structural element after said bonding step.

25. A method of making a microelectronic assembly comprising:

(a) providing a first element having a first surface and a plurality of leads extending over said first surface, said leads having anchor ends attached to said first element and tip ends remote from said anchor ends, the tip ends being releasably attached to said first element;

(b) connecting said tip ends of said leads to a second element, said releasable attachment maintaining said tip ends in position relative to said first element at least until commencement of said connecting step;

(c) causing differential expansion or contraction of said elements so as to move said tip ends relative to said first element and break at least some of said releasable attachments; and then
wherein one of said elements includes one or more semiconductor chips and the other one of said elements includes a conductive sheet, the method further comprising the step of removing portions of said conductive sheet so as to form a plurality of terminals connected to said leads after the adhesion between said portions of said leads adjacent the tip ends and said first element is broken.

26. A method as claimed in claim 25 further comprising the steps of moving said elements away from one another so as to bend the tip ends of the leads toward a vertically-extensive disposition; introducing a curable material between said elements during or after said moving step; and curing said curable material to form a layer between said elements surrounding said leads prior to said step of removing portions of said conductive sheet to form said terminals.

27. A method as claimed in claim 25 wherein said conductive sheet constitutes said second element, and wherein said step of connecting the tip ends of the leads to said second element includes bonding the tip ends of the leads to said conductive sheet.

28. A method as claimed in claim 25 further comprising the step of moving said elements away from one another through a predetermined displacement so as to bend the tip ends of the leads toward a vertically-extensive disposition.

29. A method as claimed in claim 28 wherein buckling of the leads impels the elements vertically away from one another.

30. A method as claimed in claim 28 further comprising the step of introducing a curable material between said elements during or after said moving step, and curing said curable material to form a layer between said elements surrounding said leads.

31. A method as claimed in claim 28 further comprising connecting restraining straps between said elements prior to said step of causing differential expansion or contraction, said restraining straps being stronger than said leads, said restraining straps urging said elements away from one another during said movement step.

32. A method as claimed in claim 31 wherein said restraining straps at least partially constrain relative movement of said elements in horizontal directions parallel to said first surface.

33. A method as claimed in claim 28 wherein at least some of said leads are curved at the conclusion of said moving step.

34. A method as claimed in claim 33 wherein at least some of said leads are curved prior to said moving step.

\* \* \* \* \*

UNITED STATES PATENT AND TRADEMARK OFFICE
CERTIFICATE OF CORRECTION

PATENT NO. : 6,627,478 B2
DATED : September 30, 2003
INVENTOR(S) : John W. Smith and Christopher M. Pickett It is certified that error appears in the above-identified patent and that said Letters Patent is hereby corrected as shown below:

Column 8,
Line 7, "chip lib" should read -- chip 11b --.

Column 9,
Line 65, "52c" should read -- 54c --.

Column 13,
Line 14, "heating in" should read -- heating is --.
Line 20, "leads 216" should read -- leads 214b and 214a -- .
Line 24, "218a" should read -- 218a. --.
Line 28, "216a" should read -- 214a --.
Line 32, "246b of" should read -- 246b away from anchor 216b of --.

Column 14,
Line 32, "components 452" should read -- components 450 --.
Line 39, "components 452" should read -- components 450 --.
Line 49, "leads 454" should read -- leads 452 --.
Line 60, "411 and 432" should read -- 411 and 433 --.
Line 63, "components 452" should read -- components 450 --.

Column 15,
Line 29, "platens r restraining" should read -- platens restraining --.

Column 16,
Line 18, "assembly" should read -- assembly comprising: --.
Lines 41-42, "method of making a microelectronic assembly as claimed in claim 1" should read -- method as claimed in claim 2 --.
Lines 54-55, "method of making a microelectronic assembly as claimed in claim 1" should read -- method as claimed in claim 2 --.
Lines 64-65, "method of making a microelectronic assembly as claimed in claim 1" should read -- method as claimed in claim 2 --.

Column 17,
Lines 31-32, "method of making a microelectronic assembly as claimed in claim 1" should read -- method as claimed in claim 2 --.

UNITED STATES PATENT AND TRADEMARK OFFICE
CERTIFICATE OF CORRECTION

PATENT NO. : 6,627,478 B2
DATED : September 30, 2003
INVENTOR(S) : John W. Smith and Christopher M. Pickett It is certified that error appears in the above-identified patent and that said Letters Patent is hereby corrected as shown below:

Column 18,
Lines 1-2, "method of making a microelectronic assembly as claimed in claim 1" should read -- method as claimed in claim 2 --.

Signed and Sealed this

Twentieth Day of January, 2004

JON W. DUDAS
*Acting Director of the United States Patent and Trademark Office*